United States Patent
Hoffmann et al.

(10) Patent No.: US 7,518,142 B2
(45) Date of Patent: Apr. 14, 2009

(54) ENCAPSULATION FOR ORGANIC DEVICE

(75) Inventors: Uwe Hoffmann, Alzenau (DE); Jose Manuel Dieguez-Campo, Hanau (DE); Frank Stahr, Arnsdorf (DE); Klaus Schade, Moritzburg (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 0 days.

(21) Appl. No.: 11/761,770

(22) Filed: Jun. 12, 2007

(65) Prior Publication Data
US 2007/0290201 A1 Dec. 20, 2007

(30) Foreign Application Priority Data
Jun. 13, 2006 (DE) .................. 10 2006 027 393

(51) Int. Cl.
*H01L 35/24* (2006.01)

(52) U.S. Cl. .............. 257/40; 257/59; 257/E21.476; 257/E31.006; 438/99; 438/82; 438/29; 438/21

(58) Field of Classification Search .......... 257/40, 257/59, 400; 438/21, 29, 99; 313/510–512
See application file for complete search history.

(56) References Cited
U.S. PATENT DOCUMENTS
6,198,217 B1  3/2001  Suzuki et al.

2003/0027369 A1 * 2/2003 Yamazaki ............... 438/21
2005/0029513 A1   2/2005 Kawashima et al.

FOREIGN PATENT DOCUMENTS

| DE | 10222958 A1 | 10/2003 |
|---|---|---|
| DE | 102006027393 A1 | 12/2007 |
| EP | 777280 A2 | 6/1997 |
| WO | WO 03/016589 A1 | 2/2003 |
| WO | WO 03/050894 A2 | 6/2003 |

* cited by examiner

*Primary Examiner*—Dung A. Le
(74) *Attorney, Agent, or Firm*—Townsend and Townsend and Crew LLP

(57) ABSTRACT

The present invention concerns a thin-film encapsulation structure for electronic devices with organic substances, especially OLEDs or other organic optoelectronic devices as well as corresponding components and a process for the production with a primary, inorganic barrier layer (5), which is directly arranged on the device or the surface to be encapsulated; a planarization layer (6) arranged on the primary, inorganic barrier layer, the thickness of said planarization layer selected such that it is thicker than the simple value of the distance between highest peak and deepest valley of the surface of the primary barrier layer or the surface of the device under the primary barrier layer or the surface to be encapsulated, as well as a secondary barrier layer (14) arranged on the planarization layer.

16 Claims, 2 Drawing Sheets

ENCAPSULATION FOR ORGANIC DEVICE

PRIORITY

This application claims priority under 35 U.S.C. § 119(a) to DE 10 2006 027 393, filed Jun. 13, 2006, the entire disclosure of which is incorporated herein by reference for all purposes.

BACKGROUND OF THE INVENTION

Field of the Invention

The present invention concerns a thin-film encapsulation structure for electronic devices with organic substances, especially OLEDs or other organic, optoelectronic devices as well as a method for the production of such thin-film encapsulation structures and electrotechnical parts fitted therewith.

For organic electronic devices, especially OLEDs (organic light emitting diodes), gastight and moisture-proof encapsulation is needed in order that oxygen and especially moisture from the environment may be kept away from the sensitive organic substances and the electrodes, which are often reactive. To this end, it is widely established practice to provide hermetic housings of glass and metal using inserts or so-called gettering materials in order that oxygen and moisture may be kept at bay or at least intercepted by the gettering materials before they reach the organic substances. However, such hermetic housings have large masses and corresponding dimensions, such that they are unsuitable for certain applications and in addition entail high manufacturing effort. Moreover, the metals lack transparency, so that they are also unsuitable for certain applications.

A well-known method for preventing such disadvantages is thin-film encapsulation in which a housing is dispensed with and, instead, stacks of various thin layers are applied for the purpose of limiting or preventing transmissions of water and/or oxygen.

Thin-film encapsulation of this kind is described, for example, in WO 03/050894 A2, which proposes a plurality of different dielectric layers and the entire disclosure of which is incorporated herein by reference for all purposes. The dielectric layers are preferably formed from inorganic layers that have a high barrier effect. Since, however, the inorganic layers have low elasticity and thus make hardly any contribution to dissipation of the mechanical stresses, stacks of inorganic layers readily lead to cracking, such that water and oxygen can penetrate via the cracks. For this reason, provision between the inorganic layers of organic layers or polymer layers that have a higher elasticity and thus counteract cracking is already known. Such a layer structure is proposed, for example, in WO 03/016589 A1, the entire disclosure of which is incorporated herein by reference for all purposes.

The combining of organic and inorganic layers in stack of layers is also known from EP 777 280, U.S. Pat. No. 6,198,217, DE 102 22 958 and US 2005/0029513 A1, the entire disclosure of each of which is incorporated by reference for all purposes.

Although good results are obtained thereby, the layers of the prior art have the disadvantage that the plurality of the layers entails high production effort. In addition, it has transpired that, despite all kinds of layers, the sealing function is ultimately unsatisfactory.

SUMMARY OF THE INVENTION

It is therefore the object of the present invention to provide thin-film encapsulation as well as a method for the production of the same, which, with small outlay, i.e. with as few layers as possible, exhibits improved sealing relative to the prior art, while maintaining at the same time the other fundamental conditions, for example high transmission of light in the visible wavelength range or simple process control.

This object is achieved with a thin-film encapsulation structure having the characteristics of claim 1, an electrotechnical component with a corresponding encapsulation structure in accordance with claim 14 as well as a method for the production of a thin-film encapsulation structure having the characteristics of claim 17. Advantageous embodiments are the object of the dependent claims.

The invention is characterised by the fact that the inventors have recognized that an essential aspect is that roughness, particulate deposits—for example through particle generation in vacuum coating installations themselves—or structures on the surface to be encapsulated can negatively affect the encapsulation properties. Since, especially in the case of OLEDs, such surface unevenness or roughness in the form of steps or recesses are present due to corresponding structurings and since cost pressures preclude manufacturing conditions in a dust-free environment comparable to that of semiconductor circuit fabrication, it is essential, for the purpose of an effective and simple encapsulation structure, to eliminate the unevenness or roughness by means of a planarization layer.

Additionally, the present invention is characterised by the fact that the planarization layer is arranged only after a primary barrier layer on the surface to be encapsulated or the organic device, since that allows a simple production process to be realized. The effect of the primary, inorganic barrier layer is to protect the organic substances against the influences of subsequent layer deposition. This facilitates effective and simple application of the planarization layer, which is of importance for effective encapsulation by means of the secondary barrier layer subsequently arranged on the planar surface of the planarization layer.

The overall approach therefore consists in first arranging a primary, inorganic barrier layer directly on the device to be protected or the surface to be encapsulated in order that initial protection may be provided for the device or the surface to be encapsulated. Subsequently, an organic planarization layer is applied, which compensates surface unevenness, layer growth defects or structurings and mechanical stresses and forms the basis whereby an effective barrier effect may be obtained with a few subsequent barrier layers. Accordingly, the invention provides for a secondary barrier layer on the planarization layer, said barrier layer, due to the non-presence or lesser formation of unevenness, such as steps, recesses and the like, capable of being applied in a very effective way.

In order that it may be ensured that the organic planarization layer may provide for a point-defect-eliminating compensation of surface unevenness or structures, its thickness is selected such that it is thicker than the simple value of the distance between the highest peak and the deepest valley of the surface of the primary barrier layer or the surface of the device or the surface to be encapsulated that is beneath the primary barrier layer.

The simple value of the distance between the highest peak and the deepest valley of each surface to be coated is determined in accordance with the usual standard for the maximum profile height $R_y$ (ISO/JIS/DIN 4762) and is defined as the sum of the distances of the highest peak and the deepest value from the centre line.

Preferably, the secondary barrier layer has several sublayers, with especially two or more inorganic sublayers being provided, which exhibit particularly favourable barrier effects for moisture and oxygen. The provision of several sublayers ensures that any defects in one of the sublayers do not lead to a leakage.

Preferably, at least one organic, preferably several, especially two organic sublayers, are provided in the secondary barrier layer, which are especially arranged between the inorganic sublayers or sandwich these between them. Through the increased elasticity of the organic sublayers relative to the inorganic sublayers, these also contribute to the dissipation of mechanical stresses and thus prevent cracking, which would likewise lead to leakage.

The sublayers of the secondary barrier layer, especially the organic sublayers, are preferably formed such that their thickness corresponds at least to the adjacent layer or sublayer in the encapsulation structure in the direction of the device or the surface to be protected, or at least amounts to the simple value of the distance between the highest peak and the deepest valley of the adjacent layer or sublayer in the encapsulation structure in the direction of the device or the surface to be protected.

The setting of a corresponding thickness ensures that the encapsulation does not fail in the event of any defects.

Preferably, the organic sublayers are adjusted such that they correspond to the thickness of adjacent inorganic sublayers especially in the direction of the device or the surface to be protected, while the thickness of the inorganic sublayers amounts to at least the simple value of the distance between the highest peak and the deepest value of the surface lying in the direction of the device or the surface to be protected, preferably, however, at least 20 nm.

In a preferable embodiment, a hydrophobic layer is arranged at least on the second or secondary barrier layer for the purpose of avoiding accumulation of water or moisture on the surface in order that moisture penetration may be avoided from the outset. Accordingly, the hydrophobic layer is chosen such that its surface energy is so large that the contact angle with water is preferably greater than 80°. The hydrophobic layer may be formed especially from polymers, based on hydrocarbon monomers, fluorocarbon monomers or organo-silicon monomers, with application being effected, for example, by plasma polymerization.

The primary and/or secondary barrier layer preferably have inorganic sublayers of silicon nitride, silicon carbide, silicon oxynitride or organo-silicon oxides, which are preferably applied by low-temperature PECVD (Plasma Enhanced Chemical Vapour Deposition) at temperatures below 180°, preferably below 140° C.

The planarization layer is formed in a preferable embodiment from radiation-curable polymers, photoresist or organic monomers, which are applied either by evaporation or mechanical application of a liquid or flowable polymer by means of spin-coating, spray coating or printing or by vacuum coating technology, especially plasma-enhanced vacuum coating technology.

Advantageously, the planarization layer may also be post-treated by means of radiation, e.g. UV, IR or electron beam treatment in order that polymerization or curing may be effected, as a result of which harmful thermal stressing of the optoelectronic device or substrate is prevented.

The organic sublayers of the secondary barrier layer are preferably formed from hexamethyldisiloxanes (HMDSO), hydrocarbon monomers, radiation-curable monomers, photoresists and/or polymers. These layers, too, may preferably be applied by plasma-enhanced application methods.

With an inventive thin-film encapsulation structure, water transmission rates of <10* $10^{-6}$ g/m$^2$*day, especially 5*$10^{-6}$ g/m$^2$*day as well as light transmission in the visible wavelength range of more than 80%, preferably 85%, may preferably be achieved.

The structure also ensures simple production which can be performed, for example, in an in-line installation.

BRIEF DESCRIPTION OF THE DRAWINGS

Further advantages, characteristics and features become apparent from the following detailed description of an embodiment using the enclosed drawings. The drawings show in purely schematic form.

DETAILED DESCRIPTION OF THE INVENTION

Figure 1:
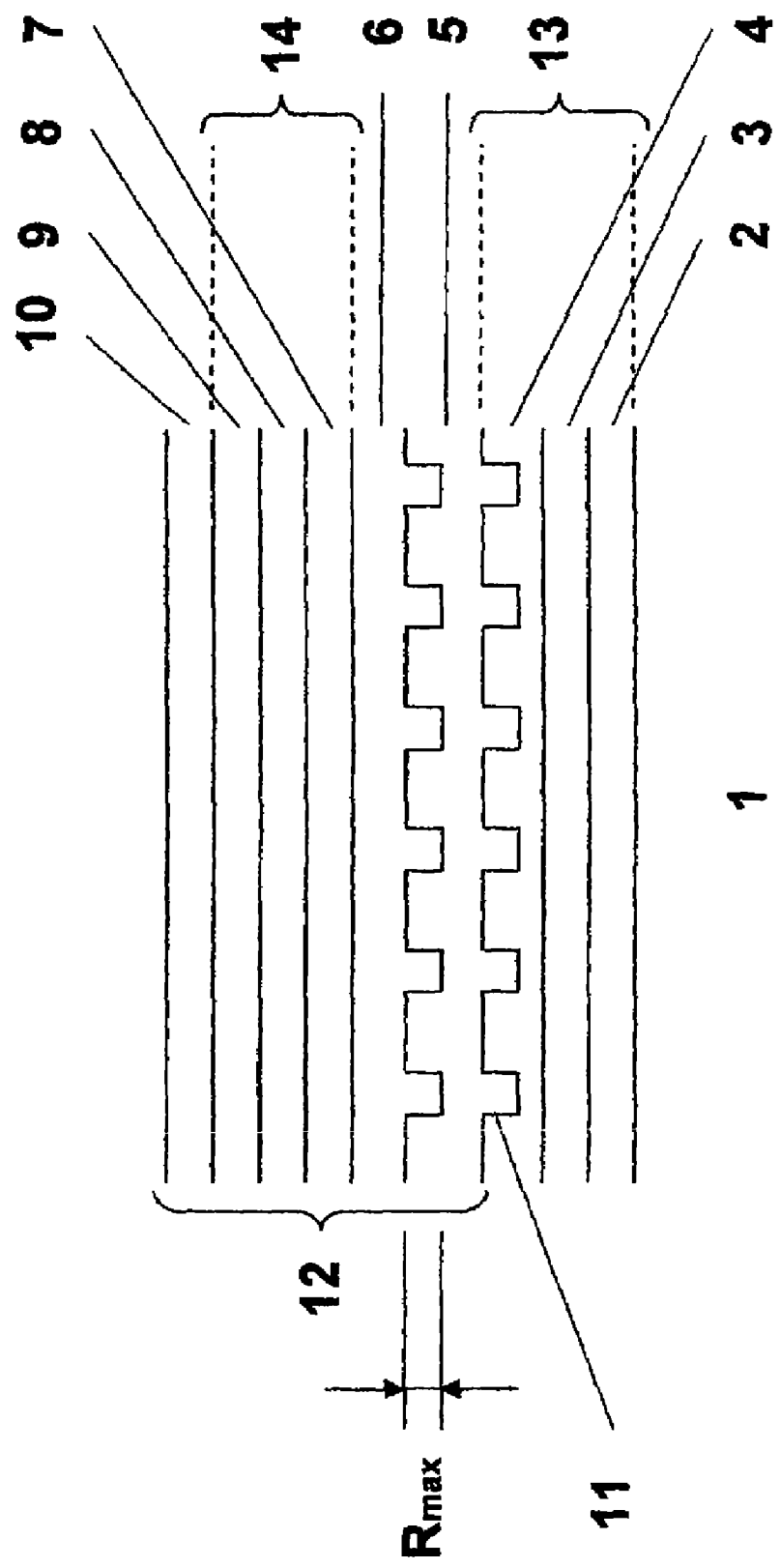
FIG. 1 a schematic cross-section of the layer structure of an inventive OLED part, and in FIG. 2. a schematic side view of an installation for the production of an inventive thin-film encapsulation structure.

FIG. 1 shows an OLED part with a thin-film encapsulation structure 12 in accordance with the present invention.

Provided between two electrode layers 2 and 4 on a substrate 1, which may be, for example, a suitable glass pane or a flexible, transparent film, is an organic electroluminescent unit 3, which may consist of several sublayers, which are not shown here. The layers 2 to 4 form an organic optoelectronic device 13, which, in the embodiment shown in FIG. 1, is an OLED. However, other organic electronic devices, for example photovoltaic devices, are also conceivable.

For the purpose of protecting the organic optoelectronic device 13, an inventive thin-film encapsulation structure 12 is applied.

The thin-film encapsulation structure 12 comprises a total of six layers 5 to 10, which are described in detail in the following.

A primary barrier layer 5 made from an inorganic substance, for example silicon nitride, silicon carbide, silicon oxynitride or a silicon compound made from an organo-silicon oxide, is applied to the electrode layer 4 of the organic device 13. Since, as shown for illustration purposes at the electrode layer 4 only, the organic device 13 has a structuring 11 or particulate deposits, structures 11, such as steps, recesses and the like, are formed at the boundary surface between electrode layer 4 and the primary barrier layer 5. These structures may also be caused by an unevenness of the substrate 1 or from its surface which is not planarized by the layer structure of the organic device 13. Said structures reform on application of the primary barrier layer 5 at the surface of the primary barrier layer then formed.

To compensate these structures or unevenness, the invention provides for the application of a planarization layer 6, e.g. of a liquid or flowable polymer, which compensates the structures 11, such that a smooth or planar surface of the planarization layer 6 is formed at the surface opposite the primary barrier layer 5. A secondary barrier layer 14, formed from the sublayers 7 to 9, is formed on the planarization layer 6.

The sublayers 7 to 9 are formed by two inorganic sublayers 7 and 9, which in turn may be formed from silicon nitride, silicon carbide, silicon oxynitride or a compound made from an organo-silicon oxide, as well as an organic intermediate or compensation layer 8, for example from a polymer produced by plasma polarization. This compensation layer 8 serves to compensate stresses and has greater elasticity than the inorganic layers 7 and 9.

Finally, the upper side of the thin-film encapsulation structure 12 is provided with a hydrophobic layer 10, which especially has a surface energy of such nature that the contact angle with water ≧80°. In this way, the tendency of moisture to deposit on the thin-film encapsulation structure 12 is reduced.

As the structure of the thin-film encapsulation structure 12 shows, the primary barrier layer ensures that the organic device 13 is protected from environmental influences prior to further application or encapsulation. The planarization layer 6 serves the purpose of compensating the roughness and unevenness, which are caused by the substrate 1 or the structuring of the organic device 13, since the surface structures would impair subsequent application of barrier layers.

Due to the planar surface provided by the planarization layer 6, it is possible with a few sublayers to apply an effective second barrier layer 14 that effectively prevents the penetration of moisture or oxygen into the organic device 13. The combination of several sublayers of the second barrier layer 14 ensures that any defects which might arise do not extend continuously through the entire barrier layer. The compensation layer 8 especially affords the possibility of dissipating mechanical stresses that may also result from the sublayers 7 and 9, which are preferably composed of inorganic material. The overall outcome is thus a layer structure, which, on the organic device 13, first provides a primary barrier layer made from an inorganic material 5, then a planarization layer 6, preferably made from an organic material, followed by an inorganic sublayer 7 of the secondary barrier layer 14. On top of that is arranged an organic compensation or sublayer 8, which in turn is followed by an inorganic sublayer 9 of the secondary barrier layer 14. Finally, a hydrophobic functional layer 10 is provided.

The thickness of the planarization layer 6 is selected especially to be thicker than the simple value of the distance between highest peak and deepest valley of the structures 11 present on the surface of the primary barrier layer, which are due to roughness of the substrate or structurings of the organic device 13 or particulate deposits.

The inorganic sublayer 7 of the secondary barrier layer 14 is preferably formed with a thickness greater than 20 nm.

The organic intermediate layer or composition layer 8 preferably has the same thickness as the adjacent inorganic sublayer 7.

Figure 2:
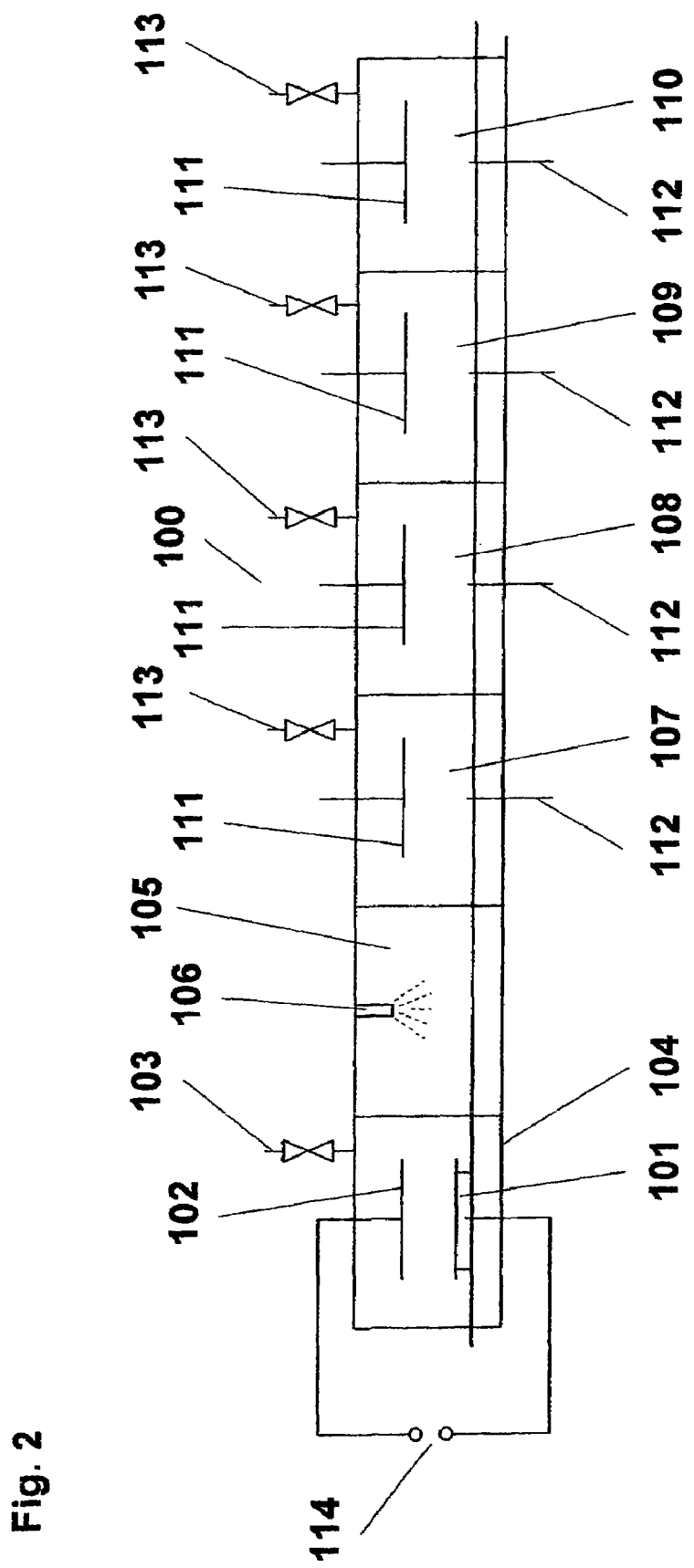

FIG. 2 is a schematic representation of an installation for the production of a thin-film encapsulation structure, as shown in FIG. 1. Such a thin-film encapsulation structure can be manufactured in accordance with the present invention in an in-line installation 100, as shown in FIG. 2.

The in-line installation 100 comprises a vacuum process chamber 104, in which the primary barrier layer is deposited by low-temperature PECVD (Plasma Enhanced Chemical Vapour Deposition). The plasma can be generated, for example, by a high-frequency alternating voltage, for which purpose is provided in the vacuum process chamber 104 an electrode 102, which, together with the substrate carrier 101 functioning as counter-electrode and the voltage source 114, can generate a corresponding plasma. The necessary process gases are introduced into the vacuum process chamber 104 via the inlet 103.

After application of the primary barrier layer by means of low-temperature PECVD, the substrate to be coated is transported on the substrate carrier 101 into an adjacent chamber 105, in which, for example, vacuum conditions need not be present. Accordingly, a corresponding lock mechanism may be provided between the two chambers 104 and 105.

In the processing chamber 105, the set atmosphere is preferably an inert gas only, in which the planarization layer 6 is applied, for example by spray coating through a spray nozzle 106. However, other application methods are conceivable, such as spin-coating, printing, evaporation or the like.

Subsequently, the substrate on the substrate carrier 101 is brought into the other vacuum coating chambers 107, 108, 109 and 110 where the remaining layers 7 to 10 are applied by plasma-enhanced methods. Accordingly each of the respective treatment chambers 107 to 110 has an electrode 111 and a corresponding power connection 112 for the substrate carrier 101. Additionally, inlets 113 are also arranged in each in order that the corresponding process gases for the low-temperature PECVD deposition or the plasma polymerization may be introduced into the corresponding process chambers.

Thus, the inorganic sublayer 7 in the treatment chamber 107 is deposited in turn by low-temperature PECVD, while the organic sublayer 8 is formed in the treatment chamber 108 by plasma polymerization. After application of a further inorganic sublayer 9 in the treatment chamber 109, again by low-temperature PECVD, the hydrophobic layer 10 is deposited in the treatment chamber 110, again by plasma polymerization.

In the following, an embodiment is described that exemplifies the manufacturing process for the encapsulation structure 12.

The vacuum chamber 104 is evacuated to a starting pressure below 1 Pa, and then process gases are introduced into the process chamber 104 at a flow rate of 100 sccm for $SiH_4$, of 300 sccm for $NH_3$, and of 300 sccm for $N_2$. A high frequency voltage with an output of 500 W is applied and a plasma is ignited for 60 seconds, which leads to the deposition of a silicon nitride layer.

Afterwards, a photoresist is applied in the treatment chamber 105 by spray coating, printing or spin-coating. Subsequently, in the same manner as in the vacuum process chamber 104, an inorganic layer, especially silicon nitride, is in turn applied in the treatment chambers 107 and 109.

In the treatment chamber 108, a hydrocarbon layer is deposited in a plasma polymerization step using a carbon-containing gas, such as $CH_4$ at a flow rate of 400 sccm, and an HF output of 100 W for 60 seconds.

Finally, a hydrophobic fluorohydrocarbon layer is then applied in the treatment chamber 110 using a fluorine-containing working gas, such as $CHF_3$, an HF output of 100 W and plasma ignition for 10 seconds.

The layer thicknesses here are 20 to 100 nm for the primary barrier layer 5, 3 to 100 μm for the planarization layer 6, 20 to 100 nm for the sublayer 7, 3 to 100 μm for the sublayer 8, 20 to 100 nm for the sublayer 9 and 5 to 100000 nm for the hydrophobic layer 10.

Although the present invention was described in detail with the preceding embodiments, it is clear to a person skilled in the art that the invention is not limited thereby, but that, in the context of the attached claims, variations and alterations are possible, which are likewise covered by the scope of protection of the claims. Especially, different characteristics of the invention may be combined or exchanged and individual characteristics may also be omitted, without departing from the protective scope of the present invention.

The invention claimed is:

1. Thin-film encapsulation structure for electronic devices with organic substances with a primary, inorganic barrier layer directly arranged on the device or the surface to be encapsulated;

a planarization layer arranged on the primary, inorganic barrier layer, the thickness of said planarization layer selected such that it is thicker than the simple value of the distance between a highest peak and a deepest valley of the surface of the primary barrier layer or the surface of the device under the primary barrier layer or the surface to be encapsulated, and a secondary barrier layer arranged on the planarization layer.

2. Encapsulation structure in accordance with claim 1, wherein the secondary barrier layer has at least one inorganic sublayer.

3. Encapsulation structure in accordance with claim 1, wherein the secondary barrier layer has at least one organic sublayer arranged between inorganic sublayers with the surface of the organic sublayers being such that it has a contact angle with water greater than 80°.

4. Encapsulation structure in accordance with claim 2, wherein the sublayers are formed such that their thickness corresponds at least to the thickness of the adjacent layer or sublayer in the direction of the device in the encapsulation structure, or at least amounts to the simple value of the distance between highest peak and deepest valley of the adjacent layer or sublayer in the direction of the device in the encapsulation structure.

5. Encapsulation structure in accordance with claim 3, wherein the thickness of the organic sublayer is at least the thickness of the adjacent inorganic sublayer in the direction of the device.

6. Encapsulation structure in accordance with claim 2, wherein the thickness of the inorganic sublayer is at least 20 nm.

7. Encapsulation structure in accordance with claim 1, wherein the secondary barrier layer comprises exactly two inorganic sublayers with an organic sublayer arranged between them.

8. Encapsulation structure in accordance with claim 1, wherein arranged on the secondary barrier is a hydrophobic layer, whose surface energy is such that the contact angle with water is greater than 80°.

9. Encapsulation structure in accordance with claim 8, wherein the hydrophobic layer comprises one or more elements selected from the group consisting of polymers, fluorocarbons monomers, fluorohydrocarbons, hydrocarbons and organosilicon monomers and compounds thereof.

10. Encapsulation structure in accordance with claim 1, wherein the primary and/or secondary barrier layer comprises one or more elements selected from the group consisting of silicon nitride, silicon carbide, silicon oxynitride and compounds made from organosilicon oxide.

11. Encapsulation structure in accordance with claim 1, wherein the planarization layer comprises one or more elements selected from the group consisting of polymers, photoresists, hydrocarbons, fluorohydrocarbons, radiation-curable monomers and organic monomers.

12. Encapsulation structure in accordance with claim 1, wherein an organic sublayer of the secondary barrier layer comprises one or more elements selected from the group consisting of organosilicon compounds, hexamethyldisiloxanes (HMDSO), hydrocarbon monomers and polymers.

13. Encapsulation structure in accordance with claim 1, wherein the structure has a water transmission rate of less than $10*10^{-6}$ g/m$^2$*day as well as light transmission in the visible wavelength range of more than 80%.

14. Electrotechnical component with at least one organic substance on one side of which is an encapsulation structure in accordance with claim 1.

15. Component in accordance with claim 14, wherein further comprising a substrate, on which is provided an organic optoelectronic device, with the encapsulation structure on the optoelectronic device and/or the substrate being provided as fully encapsulating.

16. Encapsulation structure in accordance with claim 1, wherein the water transmission rate is less than $5*10^{-6}$ g/m$^2$*day and the light transmission in the visible wavelength range is more than 85%.

* * * * *